United States Patent
Dornbusch

(10) Patent No.: US 7,477,495 B2
(45) Date of Patent: Jan. 13, 2009

(54) SYSTEM AND METHOD OF ESD PROTECTION OF INTEGRATED CIRCUIT COMPONENTS

(75) Inventor: Andrew W. Dornbusch, Austin, TX (US)

(73) Assignee: Silicon Laboratories, Inc., Austin, TX (US)

( * ) Notice: Subject to any disclaimer, the term of this patent is extended or adjusted under 35 U.S.C. 154(b) by 243 days.

(21) Appl. No.: 11/301,612

(22) Filed: Dec. 13, 2005

(65) Prior Publication Data

US 2007/0133137 A1 Jun. 14, 2007

(51) Int. Cl.
*H02H 9/00* (2006.01)
(52) U.S. Cl. .................. 361/56; 361/91.1; 361/111; 331/117 FE; 331/62
(58) Field of Classification Search .............. 361/56, 361/91.1, 111; 331/117 FE, 62
See application file for complete search history.

(56) References Cited

U.S. PATENT DOCUMENTS

| | | | |
|---|---|---|---|
| 5,500,596 A * | 3/1996 | Grist et al. .............. | 324/318 |
| 5,576,557 A | 11/1996 | Ker et al. | |
| 5,929,649 A | 7/1999 | Cramer | |
| 6,064,277 A * | 5/2000 | Gilbert .................. | 331/117 R |
| 6,137,153 A * | 10/2000 | Le et al. ................. | 257/532 |
| 6,304,146 B1 | 10/2001 | Welland | |
| 6,323,735 B1 | 11/2001 | Welland et al. | |
| 7,113,050 B1 * | 9/2006 | Lindgren .............. | 331/117 FE |
| 2005/0062553 A1 * | 3/2005 | Jeon et al. .............. | 331/167 |

OTHER PUBLICATIONS

"ESD-Induced Circuit Performance Degradation in RFICs," Ke Gong et al., Integrated Electronics Laboratory, Department of Electrical & Computer Engineering, Illinois Institute of Technology, Chicago, Illinois.

* cited by examiner

*Primary Examiner*—Michael J Sherry
*Assistant Examiner*—Tien Mai
(74) *Attorney, Agent, or Firm*—Larson Newman; Abel & Polansky LLP

(57) ABSTRACT

An integrated circuit includes first and second power supply voltage terminals, a voltage controlled oscillator (VCO), and a deep N-well field effect transistor (FET). The VCO has a first node coupled to the first power supply terminal, a second node, and first and second oscillator output terminals, at least one of which is coupled to a common pin. The deep N-well field-effect transistor (FET) has a first terminal coupled to the second node of the voltage controlled oscillator, a second terminal coupled to the second power supply terminal, and a control electrode to receive a power on signal, a deep N-well is coupled to the first power supply terminal and a P-channel is coupled to the second power supply terminal to form a high impedance electrostatic discharge path between the common pin and the first and the second power supply terminals through the deep N-well.

23 Claims, 7 Drawing Sheets

US 7,477,495 B2

SYSTEM AND METHOD OF ESD PROTECTION OF INTEGRATED CIRCUIT COMPONENTS

BACKGROUND

1. Field of the Disclosure

The present disclosure generally relates to integrated circuits, and more particularly to integrated circuits with electrostatic discharge protection circuits.

2. Description of the Related Art

An electrostatic discharge (ESD) event is a common phenomenon that can occur during handling of integrated circuit (IC) devices. Typically, an electrostatic charge accumulates for any of a variety of reasons and discharges onto the IC device, and may cause damage to the IC device and/or to components of the IC device. Such damage can occur during fabrication, during assembly, and during subsequent handling. ESD events may also occur during operation of the IC device.

Conventionally, integrated circuits are protected from ESD events either by insulating all pins of the circuit from external exposure or by adding ESD protection circuitry. Unfortunately, it is sometimes undesirable or impractical to insulate the pin from the outside world. Moreover, as IC device fabrication technologies have advanced and IC device miniaturization has become increasingly common and desirable, ESD protection devices and structures increasingly have introduced parasitic impacts on circuit performance.

In cellular phone applications, for example, voltage controlled oscillators (VCOs) are often used to provide mixing signals. While the details of the implementation of the oscillators may differ, the VCO typically includes an inductor in parallel with a fixed capacitor and a variable capacitor to form a parallel resonant oscillator. Often, inductors of the VCOs are circuit board mounted or "off-package," as opposed to being integrated into the circuit. In one configuration, described in U.S. Pat. No. 6,323,735, bondwire inductors can be used to create the inductive component of the oscillator. Due to the sensitivity of the VCO, introduction of an ESD protection circuit can adversely impact the performance of the oscillator. The parasitic impacts of the ESD protection circuitry can introduce a dominant loss mechanism in the oscillator, such as an inductance or capacitance that dwarfs the typical oscillator components and causes the VCO to fail.

Since the pins are typically exposed and since ESD protection circuitry adversely impacts performance of the VCO, the gates and drains of the amplifier transistors within the VCO can be exposed directly to ESD events and associated transients.

Therefore, there is a need for ESD protection techniques that provide ESD protection for an IC having exposed pins without adversely impacting the performance of the IC.

SUMMARY

In one embodiment, an integrated circuit includes first and second power supply voltage terminals, a voltage controlled oscillator (VCO), and a deep N-well field effect transistor (FET). The VCO has a first node coupled to the first power supply terminal, a second node, and first and second oscillator output terminals, at least one of which is coupled to a common pin. The deep N-well field-effect transistor (FET) has a first terminal coupled to the second node of the voltage controlled oscillator, a second terminal coupled to the second power supply terminal, and a control electrode to receive a power on signal, a deep N-well is coupled to the first power supply terminal and a P-channel is coupled to the second power supply terminal to form a high impedance electrostatic discharge path between the common pin and the first and the second power supply terminals through the deep N-well.

In another embodiment, an integrated circuit includes first and second power supply voltage terminals, a VCO, a first electrical switch, and an ESD circuit. The VCO has a first node coupled to the first supply terminal, a second node, and first and second oscillator output terminals, at least one of which is coupled to a common pin. The first electrical switch has a first terminal coupled to the second node, a second terminal coupled to the second supply terminal, and a control terminal to receive an activation signal. The first electrical switch provides a high impedance in an electrostatic discharge (ESD) path between the common pin and the second supply terminal when the first electrical switch is inactive. The ESD circuit is coupled to the VCO and to the second supply terminal to provide a low impedance ESD path between the common pin and the second power supply voltage terminal when the first electrical switch is inactive.

In another embodiment, an electrical circuit includes a common pin, a first and a second power supply terminals, a circuit component, and an electrostatic discharge (ESD) protection system. The circuit component has a first node coupled to the first supply terminal and a second node coupled to the second supply voltage terminal, and is coupled to the common pin. The circuit component has first and second output terminals. The ESD protection system is coupled between the circuit component and the first and the second power supply voltage terminals to isolate electrically the circuit component from the first and the second power supply voltage terminals and to provide a parallel path to ground for transients, when the integrated circuit is inactive.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DESCRIPTION OF THE DRAWINGS

Figure 1:
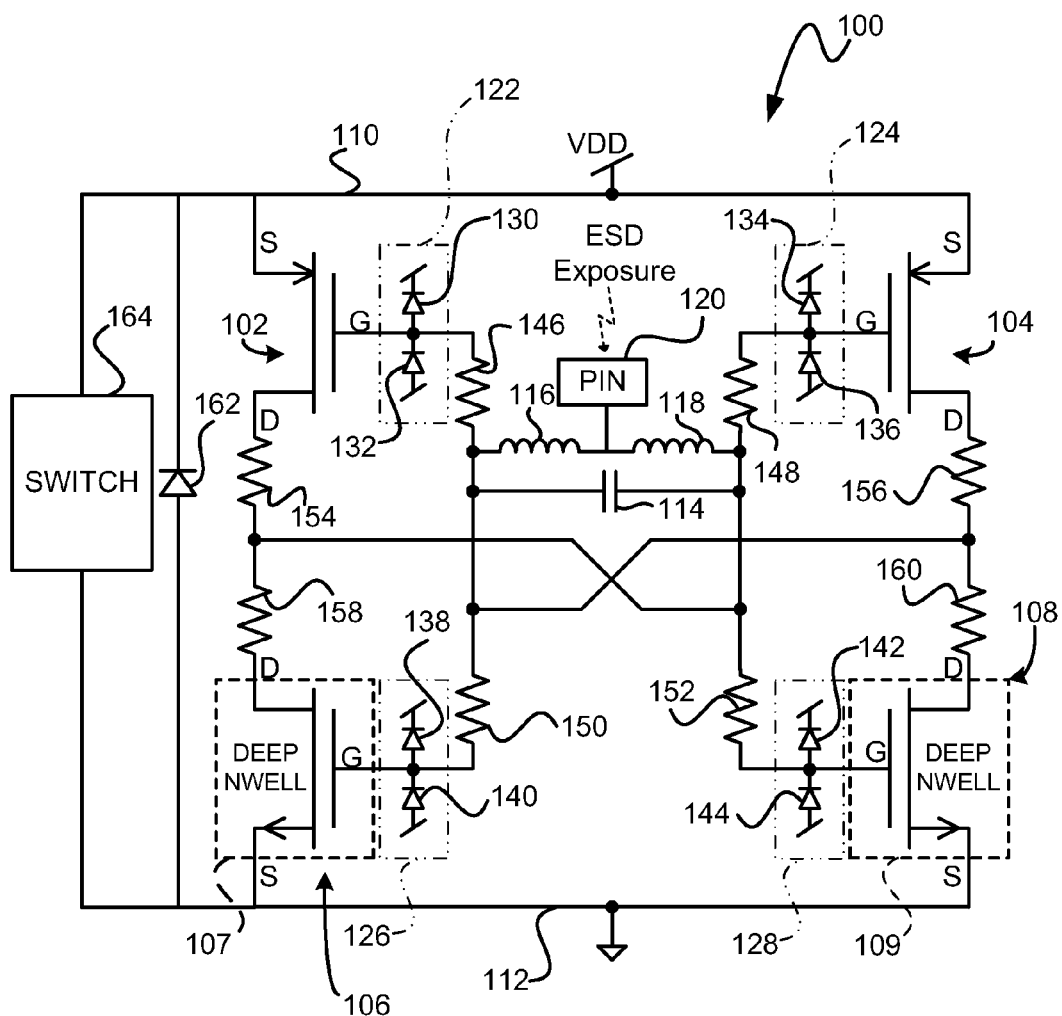
FIG. 1 illustrates in partial block diagram and partial schematic form a conventional voltage controlled oscillator (VCO) using bondwire inductors and having diode-based ESD protection.

FIG. 1 is an example of a conventional voltage controlled oscillator (VCO) circuit 100 with diode-based ESD protection. The VCO circuit 100 includes two P-channel metal-oxide semiconductor (MOS) transistors 102 and 104 and two N-channel deep N-well MOS transistors 106 and 108 arranged to form an oscillator circuit. The MOS transistor 106 has a deep N-well 107, and the MOS transistor 108 has a deep N-well 109. The MOS transistor 102 includes a source (first) terminal connected to a voltage supply terminal 110, a gate (control) terminal, and a drain (second) terminal. The MOS transistor 106 includes a drain (first) terminal coupled to the drain terminal of the MOS transistor 102, a gate (control) terminal coupled to the gate terminal of the MOS transistor 102, and a source (second) terminal connected to a second supply voltage terminal 112. The MOS transistor 104 includes a source (first) terminal connected to the first voltage supply terminal 110, a gate (control) terminal, and a drain (second) terminal. The MOS transistor 108 includes a drain (first) terminal coupled to the drain terminal of the MOS transistor 104, a gate (control) terminal coupled to the gate terminal of MOS transistor 104, and a source (second) terminal connected to the second supply voltage terminal 112.

The drain terminals of the MOS transistor 102 and of the MOS transistor 106 are coupled to the gate terminals of the MOS transistors 104 and 108. Similarly, the drain terminals of MOS transistor 104 and of the MOS transistor 108 are coupled to the gate terminals of the MOS transistors 102 and 106. Additionally, the gate terminals of the MOS transistors 102, 104, 106, and 108 are capacitively coupled through a capacitor 114 and inductively coupled through two bondwire inductors 116 and 118, which are connected to a common pin 120 of the circuit 100. Generally, the arrangement of the transistors 102, 104, 106, and 108 and the capacitor 114 and bondwire inductors 116 and 118 form the voltage controlled oscillator. The bondwire inductors 116 and 118 in conjunction with capacitor 114 form an inductor-capacitor (LC) tank.

Generally, it is impractical to insulate the pin 120 from the outside world. In particular, it is useful to leave the pin 120 exposed during fabrication in order to connect the bondwire inductors 116 and 118 to the pin. In some instances, the pin 120 may be used to connect to other circuit elements. Moreover, during fabrication of integrated circuits, the process of cutting the leadframe to form the integrated circuit often exposes a pin. Such exposed pins may be exposed to electrostatic discharge (ESD) events or ESD transients. Consequently, the gates and drains of the MOS transistors 102, 104, 106, and 108 can be exposed directly to the ESD transients.

VCO 100 includes ESD protection in the form of ESD protection circuits 122, 124, 126, and 128 at the gates of the MOS transistors 102, 104, 106, and 108, respectively. The ESD protection circuit 122 includes diodes 130 and 132. The diode 130 includes a cathode terminal connected to a first voltage supply and an anode terminal coupled to the gate of the MOS transistor 102. The diode 132 includes an anode terminal connected to a second voltage supply, and a cathode terminal coupled to the gate of the MOS transistor 102. The ESD protection circuit 124 includes diodes 134 and 136. The diode 134 includes a cathode terminal connected to the first supply voltage and an anode terminal coupled to the gate of the MOS transistor 104, and the diode 136 includes an anode terminal connected to the second supply voltage and a cathode terminal coupled to the gate of the MOS transistor 104. The ESD protection circuit 126 includes diodes 138 and 140. The diode 138 includes a cathode terminal connected to the first supply voltage and an anode terminal coupled to the gate of the MOS transistor 106, and the diode 140 includes an anode terminal connected to the second supply voltage and a cathode terminal coupled to the gate of the MOS transistor 106. The ESD protection circuit 128 includes diodes 142 and 144. The diode 142 includes a cathode terminal connected to the first supply voltage and an anode terminal coupled to the gate of the MOS transistor 108, and the diode 144 includes an anode terminal connected to the second supply voltage and a cathode terminal coupled to the gate of the MOS transistor 108.

Building ESD protection into the circuit 100, by adding the protection diodes 130-144, requires the addition of resistors 146, 148, 150 and 152 in series with the gates of the transistors 102, 104, 106, and 108, respectively. Additionally, such ESD protection requires the addition of resistors 154, 156, 158, and 160 in series with the drains of the transistors 102, 104, 106, and 108, respectively. This ESD protection may be in addition to ESD protection provided by a diode 162 and clamp 164 in parallel with the circuit 100.

Unfortunately, the clamping diodes 130-144 introduce a substantial, nonlinear capacitance to the LC tank of the VCO 100, which causes spurs and noise due to coupling from power supply ripple and noise. Moreover, the resistors 154-160 damp the oscillation of the VCO 100. Even if multiple parallel resistors (and transistors) are used to reduce the effective resistance, the damping effect significantly decreases the performance of the oscillator. Additionally, if the tank capacitance is digitally calibrated, then the damping resistance becomes dependent on the calibration value, which causes additional difficulty with oscillation stability.

Figure 2:
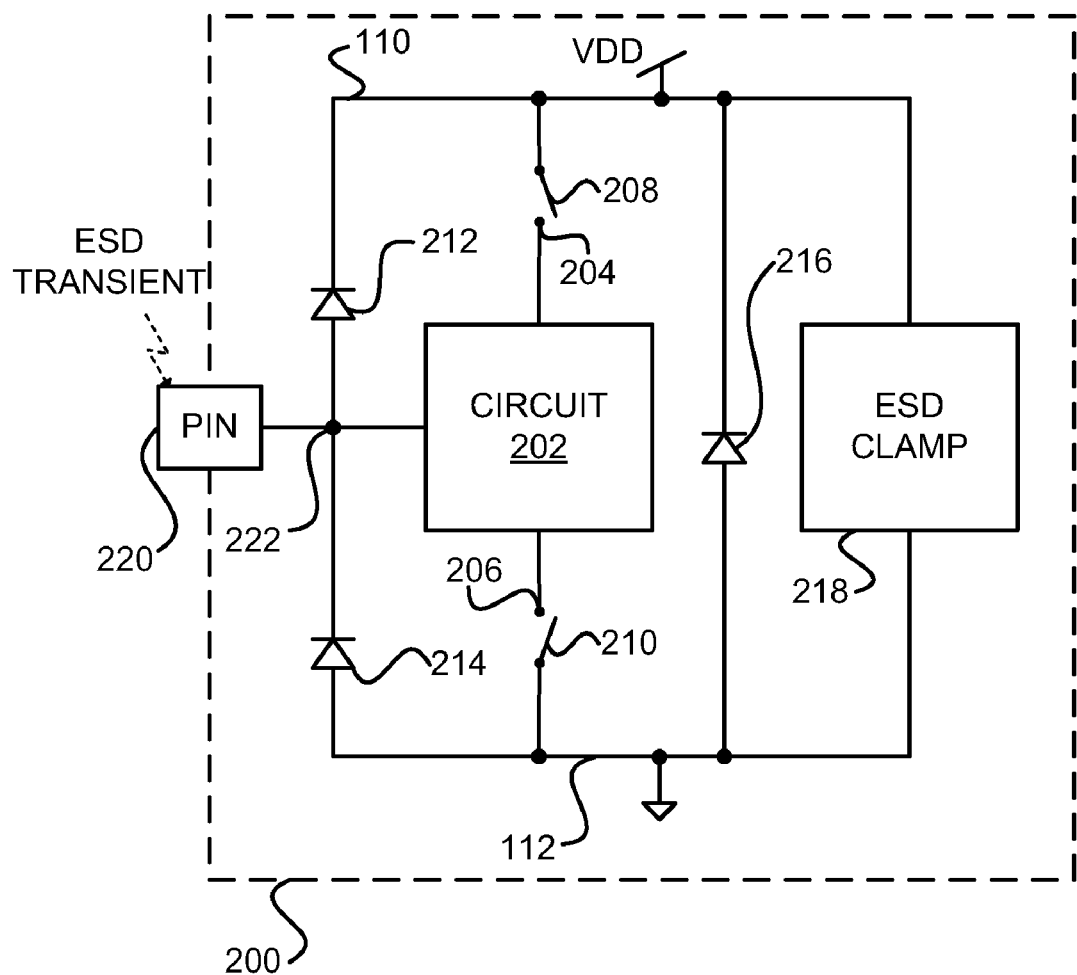
FIG. 2 is a partial block diagram and partial circuit diagram of an isolated circuit with ESD protection according to an embodiment of the present invention.

FIG. 2 is a partial block and partial circuit diagram of an isolated circuit 200 with ESD protection according to the present invention. The circuit 200 includes a functional circuit 202 (such as a VCO, a low noise amplifier, and/or other circuits), which may be sensitive to the addition of ESD protection circuitry. The circuit 200 also includes a first voltage supply terminal 110 and a second voltage supply terminal 112, a first voltage supply terminal 204, a second voltage supply terminal 206, switches 208 and 210, diodes 212, 214, and 216, an ESD clamp 218, and a pin 220. Generally, the circuit 202 is connected to first and second voltage supply terminals 204 and 206, which are coupled to first and second voltage supply terminals 110 and 112 through switches 208 and 210, respectively. The switches 208 and 210 are closed when the circuit is active (powered on) and are open (or high impedance) when the circuit 200 is inactive (powered off). Thus, when ESD transients are most likely to occur, the functional circuit 202 is isolated from the first and second voltage supply terminals 110 and 112. In one embodiment, the switches 208 and 210 can completely preclude direct current (DC) flow between the first and second voltage supply terminals 110 and 112 through functional circuit 202 when the circuit is powered off and prevent ESD discharge from the pin 220 through the circuit 202.

In an alternative embodiment, the switches 208 and 210 can have an alternative, high impedance ESD discharge path in parallel to the switch (such as multiple series parasitic diode-type PN junctions in parallel across each of the switches 208 and 210). In such an embodiment, the diodes 212, 214, and 216 and ESD clamp 218 provide a low impedance ESD discharge path in parallel with the high impedance ESD discharge path so that DC current from the ESD event will favor the lower impedance discharge path to either the first or the second voltage supply terminals 110 or 112.

The diode 212 includes a cathode terminal connected to the first voltage supply terminal 110 and an anode terminal connected to node 222. The diode 214 includes a cathode terminal connected to node 222 and an anode terminal connected to the second voltage supply terminal 112. The diode 216 includes a cathode terminal connected to the first voltage supply terminal 204 and an anode terminal connected to the second voltage supply terminal 112. The ESD clamp 218 is connected between the first and the second voltage supply terminals 110 and 112. Thus, a primary (desired) ESD discharge path is provided through the diodes 212, 214, and 216, and the ESD clamp 218 clamps or limits the electrical potential between the first and the second voltage supply terminals 110 and 112 during an ESD event, to prevent the first voltage supply terminal 110 from spiking. The diodes 212, 214, and 216 and the clamp 218 provide an ESD discharge current path in parallel to the circuit 202.

Since the sensitive circuitry 202 is isolated by switches 208 and 210, there is either no DC path through the circuit 202 or a high impedance DC current path through the circuit 202. If there is no DC path, there should be no ESD current through the circuit 202. If there is no ESD current, then ESD related design and layout rules do not apply to circuit 202. Therefore, circuit 202 can include standard devices and have a standard layout without risk of ESD related failure.

In some implementations, the switches 208 and 210 provide a high impedance ESD path relative to the ESD protection diodes 212-216 and clamp 218. Thus, ESD current flows through the lower impedance path, and not through the circuit 202.

Figure 3:
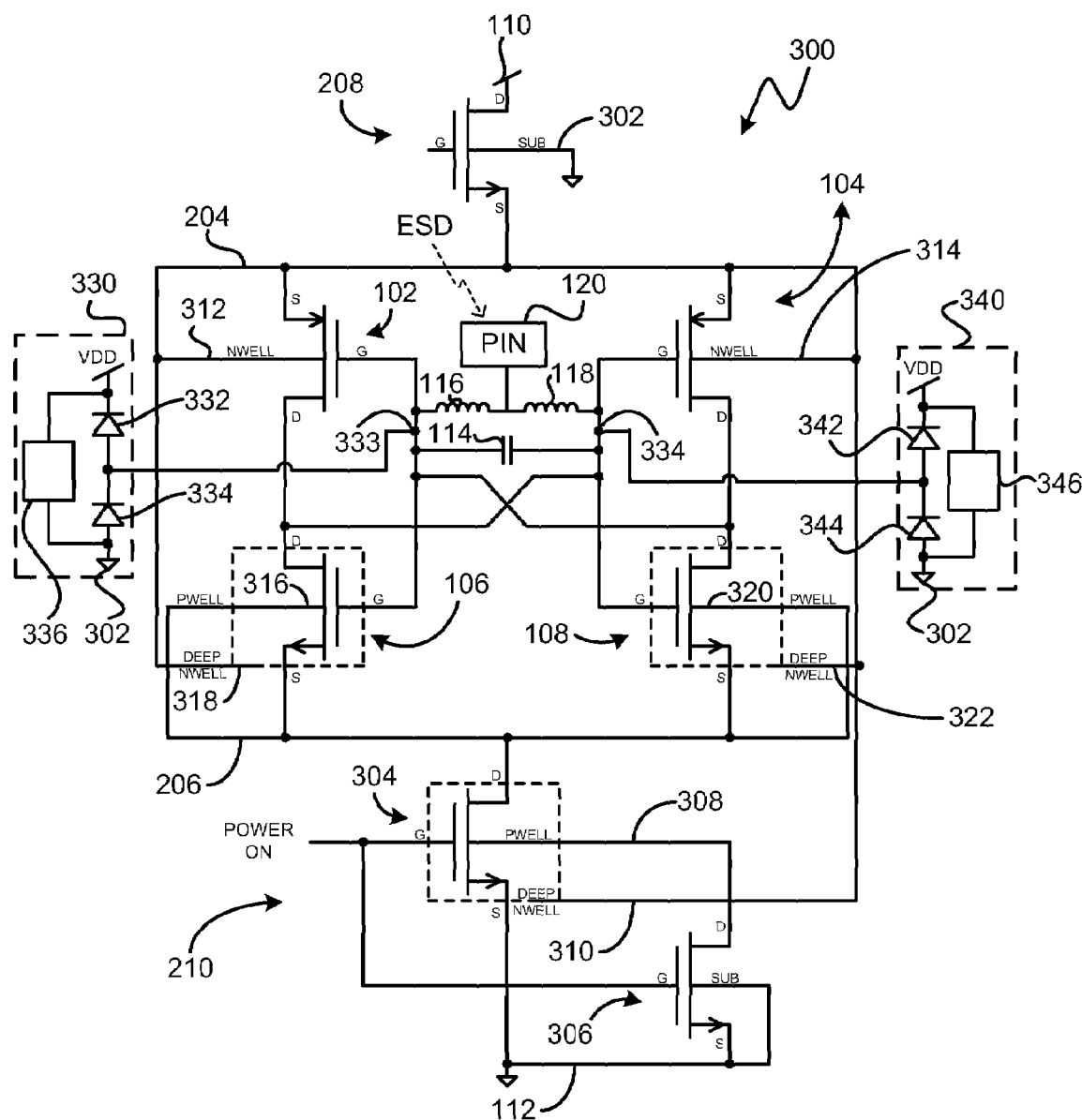
FIG. 3 is a partial block diagram and partial circuit diagram of an isolated VCO with diode-based ESD protection according to one particular embodiment of the present invention.

FIG. 3 is a circuit diagram of a particular embodiment of a circuit 300 including an isolated VCO with diode-based ESD protection. The circuit 300 includes a first voltage supply terminal 110 and a second voltage supply terminal 112, which is at ground in this instance. The first voltage supply terminal 110 is coupled to the voltage supply terminal 204 through the switch 208. The second voltage supply terminal 112 is coupled to the voltage supply terminal 206 through the switch 210. The circuit 300 includes P-channel metal-oxide semiconductor (MOS) transistors 102 and 104, n-channel MOS transistors 106 and 108, capacitor 114, and bondwire inductors 116 and 118, which are connected to a common pin 120 and arranged as described in FIG. 1 to form an LC-tank VCO oscillator circuit. It should be understood that the common pin 120 may be a j-lead, a pin, or other interconnection point to which circuit elements can be coupled and which may be exposed to ESD transients.

The transistor 102 is an N-well P-channel MOS transistor with its N-well 312 connected to the voltage supply terminal 204. The transistor 104 is an N-well P-channel MOS transistor with its N-well 314 connected to the voltage supply terminal 204. The transistor 106 is a deep N-well MOS transistor with its P-well (P-channel) 316 connected to the supply voltage terminal 206 and its N-well 318 connected to the supply voltage terminal 204. The transistor 108 is a deep N-well MOS transistor with its P-well (P-channel) 320 connected to the supply voltage terminal 206 and its N-well 322 connected to the supply voltage terminal 204.

The switch 210 includes a deep N-well MOS transistor 304 and a n-channel MOS transistor 306. The MOS transistor 304 includes a drain terminal connected to the voltage supply terminal 206, a gate terminal coupled to a power on voltage supply terminal of the circuit 300, and a source terminal connected to the second voltage supply terminal 112. The n-channel MOS transistor 306 includes a drain terminal connected to a P-well (p-channel) 308 of the MOS transistor 304, a gate terminal coupled to a power on voltage supply terminal of the circuit 300, and a source terminal connected to the second voltage supply terminal 112. A substrate of the MOS transistor 306 is connected to the second voltage supply terminal 112. The deep N-well 310 of the MOS transistor 304 is connected to the voltage supply terminal 204. The switch 210 provides the deep N-well transistor 304 with at least one cascaded channel-grounding switch 306. However, it should be understood that a plurality of deep N-well devices can be cascaded by coupling the p-channel 308 to the drain of the next N-well device, and then coupling a drain terminal of the transistor 306 to the p-channel of the last deep N-well device in the cascade. This places a minimum of three diodes in series to provide a high impedance discharge path relative to a parallel discharge path.

In general, while the transistors described above are metal-oxide semiconductor (MOS) transistors, other types of transistors may be used as well, including poly-oxide semiconductor transistors, junction field-effect transistors (JFETs), insulated-gate FETs, Gallium Arsenide devices, and so on. The following discussion uses the term MOS transistors, but it should be understood that any type of field effect transistor or field controllable device may be used, depending on the implementation. As used herein, the term "field effect transistor" or "FET" refers generally to any three terminal semiconductor device that can be used as an amplifier or a switch.

The VCO circuit is isolated from the first and second supply voltage terminals 110 and 112 by the switches 208 and 210, respectively. The switch 208 is a n-channel MOS transistor including a drain terminal connected to the first voltage supply terminal 110, a gate terminal, and a source terminal connected to the supply voltage terminal 204. The substrate of the switch 208 is connected to the second voltage supply terminal 112. The n-channel MOS transistor 208 removes the positive ESD current path.

A desired current path is provided in parallel with the VCO for the ESD currents to discharge. In this embodiment, ESD protection circuits 330 and 340 are added to the output nodes of the VCO. The ESD protection circuit 330 is coupled to the gate terminals of MOS transistors 102 and 106 (which are cross coupled to the output nodes of the VCO) and connected between the first and second voltage supply terminals 110 and 104. The ESD protection circuit 340 is coupled to the gate terminals of MOS transistors 104 and 108 and connected between the first and second voltage supply terminals 110 and 302. The ESD protection circuit 330 includes diodes 332 and 334 and clamping circuit 336. The diode 332 has a cathode terminal connected to the voltage supply terminal 110 and an anode terminal coupled to the gate of transistors 102 and 104. The diode 334 has a cathode terminal coupled to the gate of the transistors 102 and 104 and an anode terminal connected to the supply voltage terminal 302. The clamping circuit 336 includes a first terminal connected to the cathode terminal of the diode 332 and a second terminal connected to the anode terminal of the diode 334. Similarly, the ESD protection circuit 340 includes diodes 342 and 344 and clamping circuit 346. The diode 342 has a cathode terminal connected to the voltage supply terminal 110 and an anode terminal coupled to the gate of transistors 102 and 104. The diode 344 has a cathode terminal coupled to the gate of the transistors 102 and 104 and an anode terminal connected to the supply voltage terminal 302. The clamping circuit 346 includes a first terminal connected to the cathode terminal of the diode 342 and a second terminal connected to the anode terminal of the diode 344.

In the event of an ESD transient at pin 120, rather than flowing through the transistors 102, 104, 106, and 108, the DC current follows the lower impedance discharge path through the ESD protection circuits 330 and 340. In particular, a negative polarity ESD transient flows from pin 120, through bondwire inductors 116 and 118, and into the ESD protection circuits 330 and 340 to discharge. The path to the ground through the VCO transistors 102, 104, 106, and 108 passes through at least three diodes. If the ESD shunt diodes 332, 334, 342 and 344 of the ESD protection circuits 330 and 340 have sufficiently low on-voltage, then the potential between the nodes 333 and 343 and ground does not become large enough to turn on the cascaded junctions within the VCO and the switches 208 and 210. To ensure that the turn on voltage of the cascaded diodes is sufficiently high to prevent current flow, additional diodes can be added to the high impedance discharge path by cascading additional N-well devices to further isolate the VCO voltage supply terminal 206 from the substrate ground 302.

When the power supply voltage terminal 206 is pushed down below ground (by a negative ESD event, for example), the connection of the N-well transistors is reversed and the transistors become diode-connected devices. The use of deep N-well MOS transistors permits the insertion of additional diode junctions between the ground node (power supply voltage terminal 206) and the substrate ground (power supply voltage terminal 302).

By using ESD protection diodes on the output of the VCO tank, modeling of the ESD protection is simple, as is the implementation. Moreover, resistances, such as resistors 146-160 (in FIG. 1), are not needed in this circuit arrangement because the cascaded arrangement of the parasitic diodes of the transistors provides sufficiently high impedance for the ESD discharge current to favor the ESD protection circuits 330 and 340. Specifically, the resistances are not needed to increase the impedance of the discharge path through the transistors, because the switches 208 and 210 isolate the circuitry from the supply voltage terminals 110 and 302 and provide higher impedance in the form of parasitic diodes.

Figure 4:
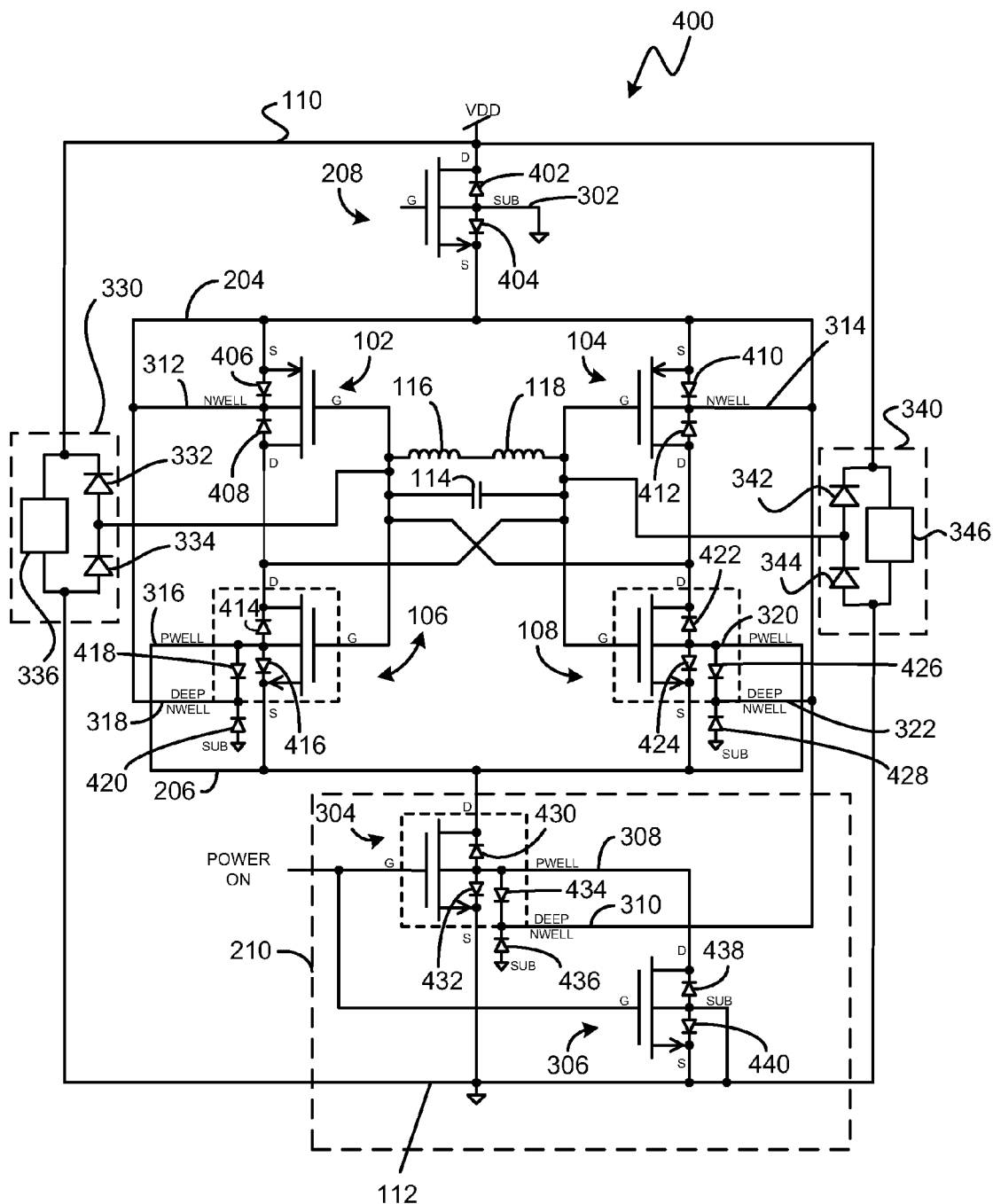
FIG. 4 is a partial block diagram and partial circuit diagram of the VCO of FIG. 3 illustrating parasitic diodes within the VCO.

FIG. 4 is a partial block and partial circuit diagram illustrating the parasitic diodes within the VCO of FIG. 3. The circuit 400 includes a first power supply voltage terminal 110 and a second power supply voltage terminal 302. The circuit 400 also includes a VCO that is isolated from the first and second power supply voltage terminals 110 and 302 by switches 208 and 210. The VCO includes transistors 102, 104, 106, and 108, a capacitor 114, and bondwire inductors 116 and 118 arranged as described above with respect to FIG. 1. The circuit 400 includes ESD protection circuits 330 and 340 connected to the output nodes of the VCO.

The switch 208 is an N-channel MOS transistor with a drain terminal connected to the first supply voltage terminal 110, a gate terminal, and a source terminal connected to the supply voltage terminal 204. The switch 208 includes a first parasitic diode 402 having an anode terminal connected to the substrate, which is connected to the second supply voltage terminal 302, and a cathode terminal connected to the drain terminal of the switch 208. The switch 208 also includes a second parasitic diode 404 having an anode connected to the substrate and a cathode connected to the source terminal.

The MOS transistor 102 includes parasitic diodes 406 and 408. The diode 406 includes an anode terminal connected to the source terminal of the MOS transistor 102 and a cathode terminal connected to the N-well 312 of the MOS transistor 102. The diode 408 includes an anode terminal connected to the drain terminal of the MOS transistor 102 and a cathode terminal connected to the N-well 312 of the MOS transistor 102.

The MOS transistor 104 includes parasitic diodes 410 and 412. The parasitic diode 410 includes an anode terminal connected to the source terminal of the MOS transistor 104 and a cathode terminal connected to the N-well 314 of the MOS transistor 104. The parasitic diode 412 includes an anode terminal connected to the drain terminal of the MOS transistor 104 and a cathode terminal connected to the N-well 314 of the MOS transistor 104.

The deep N-well MOS transistor 106 includes P-well diodes 414 and 416 and N-well diodes 418 and 420. The diode 414 includes a cathode terminal connected to the drain of the MOS transistor 106 and an anode connected to the P-channel 316 of the MOS transistor 106. The diode 416 includes a cathode terminal connected to the source of the MOS transistor 106 and an anode terminal connected to the P-channel 316 of the MOS transistor 106. The diode 418 includes an anode terminal connected to the P-channel 316 of the MOS transistor 106 and a cathode terminal connected to the deep N-well 318 of the MOS transistor 106. The diode 420 includes an anode terminal connected to the substrate and a cathode terminal connected to the deep N-well 318 of the MOS transistor 106.

Similarly, the deep N-well MOS transistor 108 includes P-well diodes 422 and 424 and N-well diodes 426 and 428. The diode 422 includes a cathode terminal connected to the drain of the MOS transistor 108 and an anode terminal connected to the P-channel 320 of the MOS transistor 108. The diode 424 includes a cathode terminal connected to the source of the MOS transistor 108 and an anode terminal connected to the P-channel 320 of the MOS transistor 108. The diode 426 includes an anode terminal connected to the P-channel 320 of the MOS transistor 108 and a cathode terminal connected to the deep N-well 322 of the MOS transistor 108. The diode 428 includes an anode terminal connected to the substrate and a cathode terminal connected to the deep N-well 322 of the MOS transistor 108.

The switch 210 includes deep N-well MOS transistor 304 and MOS transistor 306. The deep N-well MOS transistor 304 includes P-well diodes 430 and 432 and N-well diodes 434 and 436. The diode 430 includes a cathode terminal connected to the drain of the MOS transistor 304 and an anode connected to the P-channel 308 of the MOS transistor 304. The diode 432 includes a cathode terminal connected to the source of the MOS transistor 304 and an anode terminal connected to the P-channel 308 of the MOS transistor 304. The diode 434 includes an anode terminal connected to the P-channel 308 of the MOS transistor 304 and a cathode terminal connected to the deep N-well 310 of the MOS transistor 304. The diode 436 includes an anode terminal connected to the substrate and a cathode terminal connected to the deep N-well 310 of the MOS transistor 304.

The transistor 306 includes a drain terminal connected to the P-channel 308 of the MOS transistor 304, a gate terminal coupled to a power on voltage, and a drain terminal connected to the supply voltage terminal 302. The substrate of the transistor is connected to the supply voltage terminal 302. The transistor 306 includes parasitic diodes 438 and 440. The parasitic diode 438 includes a cathode terminal connected to the drain terminal of the MOS transistor 306 and an anode terminal connected to the substrate. The parasitic diode 440 includes an anode terminal connected to the substrate and a cathode terminal connected to the supply voltage terminal 302.

In a negative ESD event (e.g. when an electrostatic discharge voltage potential less than zero volts is applied to the pin 120, for example), the discharge path includes the substrate of the transistor 306, the diode 438, the P-channel 308 of the transistor 306, and the diode 430 to reach the voltage supply terminal 206. The discharge path from the voltage supply terminal 206 to the pin 120 includes a first path or a second path. The first path includes the P-channel 316, the diode 414, and the bondwire inductor 116. The second path includes the P-channel 320, the diode 422, and the bondwire inductor 118. Thus, either discharge path provides at least three diodes, and therefore a higher impedance than either ESD protection circuit 330 or 340, which provide only one diode 334 or 344 in the respective discharge path.

In a negative ESD event, there is no conductance path from the pin 120 to the first supply voltage terminal 204. This provides no opportunity for N-channel MOS transistor 208 and substrate diode 404 to pass any discharge current.

In a positive ESD event (e.g. when an electrostatic discharge voltage potential greater than zero volts is applied to the pin 120, for example), the discharge path includes a first path through the substrate of the transistor 102, the diode 408 to reach the voltage supply terminal 204. The second path includes the substrate of the transistor 104, the diode 412. There is no discharge path through the substrate of the transistor 208, the diode 404, and thus there is no discharge path through the 300, which forces all ESD discharge currents to flow through the parallel discharge paths 330 and 340.

Figure 5:
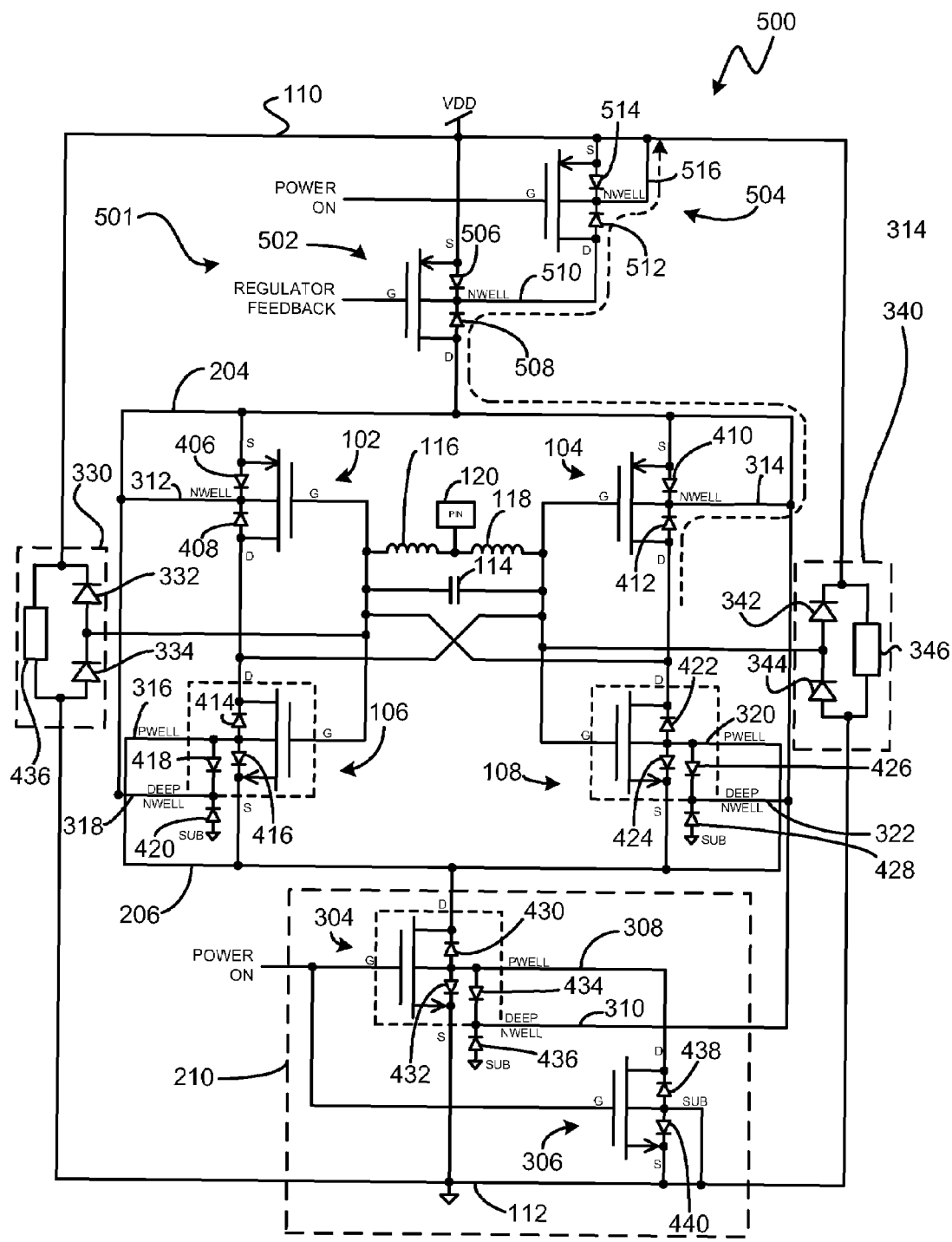
FIG. 5 is a partial block diagram and partial circuit diagram of a VCO with positive and negative ESD protection using a p-channel transistor to provide ESD isolation according to yet another particular embodiment of the present invention.

FIG. 5 is a partial block and partial circuit diagram of a VCO circuit with positive and negative ESD protection using a p-channel MOS transistor to provide positive ESD isolation according to another particular embodiment of the present invention. The circuit 500 is similar to the circuit 400 of FIG. 4; however, the switch 208 has been replaced with switch 501. The switch 501 includes P-channel MOS transistors 502 and 504. The MOS transistor 502 includes a source terminal connected to the voltage supply terminal 110, a gate terminal coupled to a regulator feedback, and a drain terminal connected to the supply voltage terminal 204. The MOS transistor 502 includes parasitic diodes 506 and 508 and an N-well (N-channel) 510. The parasitic diode 506 includes an anode connected to the source terminal of the MOS transistor 502 and a cathode terminal connected to the N-well 510. The parasitic diode 508 includes a cathode terminal connected to the N-well 510 and an anode terminal connected to the power supply voltage terminal 204.

The MOS transistor 504 includes a source terminal connected to the power supply voltage terminal 110, a gate terminal coupled to a power on voltage supply terminal, and a drain terminal connected to the N-well 510 of the MOS transistor 502. The MOS transistor 504 includes parasitic diodes 512 and 514 and an N-well 516. The parasitic diode 512 includes an anode terminal connected to the drain of the MOS transistor 504 and a cathode terminal connected to the N-well 516. The parasitic diode 514 includes an anode terminal connected to the source terminal of the MOS transistor 504 and a cathode terminal connected to the N-well 516.

In a positive polarity ESD event, current discharges from pin 120, through inductor 118, either through the diode 406 and the N-well 312 to the power supply terminal 204 or through the diode 412 and the N-well 314 to the power supply terminal 204. The current discharges from the power supply terminal 204 through the parasitic diode 508, the N-well 510, the parasitic diode 512, and the N-well 516 to the power supply voltage terminal 110. Depending on the specific implementation, multiple P-channel MOS transistors can be cascaded by coupling the N-well to the drain of the next MOS transistor to provide additional diode junctions between the pin 120 and the voltage supply terminal 110.

In general, by implementing the ESD protection circuits 330 and 340 as ESD protection diodes on the VCO tank, modeling of the ESD protection and the VCO is simple. Moreover, the ESD protection circuits do not introduce inductance mismatch issues. However, the ESD diodes must be of sufficient size so that the diode turn on voltage of the ESD protection devices 330 and 340 do not exceed the turn on voltages of the combined parasitic diodes of the various transistors.

In one embodiment to limit ESD diode capacitance, smaller shunt diodes were used for ESD protection. Table 1 shows the relationship between PN diode carrier-mobility squared ($\mu m^2$) and phase noise degradation in decibels (dB).

TABLE 1

| PN Diode ($\mu m^2$) | Phase Noise Degradation (dB) |
|---|---|
| 25 | 0.23 |
| 50 | 0.47 |
| 100 | 0.73 |
| 200 | 1.85 |

Thus, to minimize VCO performance degradation, the 25 $\mu m^2$ diodes may be desirable. ESD performance is then limited by the current-carrying capacity of the two 25 $\mu m^2$ diodes. If low voltage transistors (such as 3.3 volt transistors) are used, then the ESD diodes should have a fairly low turn on voltage. Unfortunately, if high voltage ESD events are expected, larger discharge diodes within the ESD discharge path may be desirable.

Figure 6:
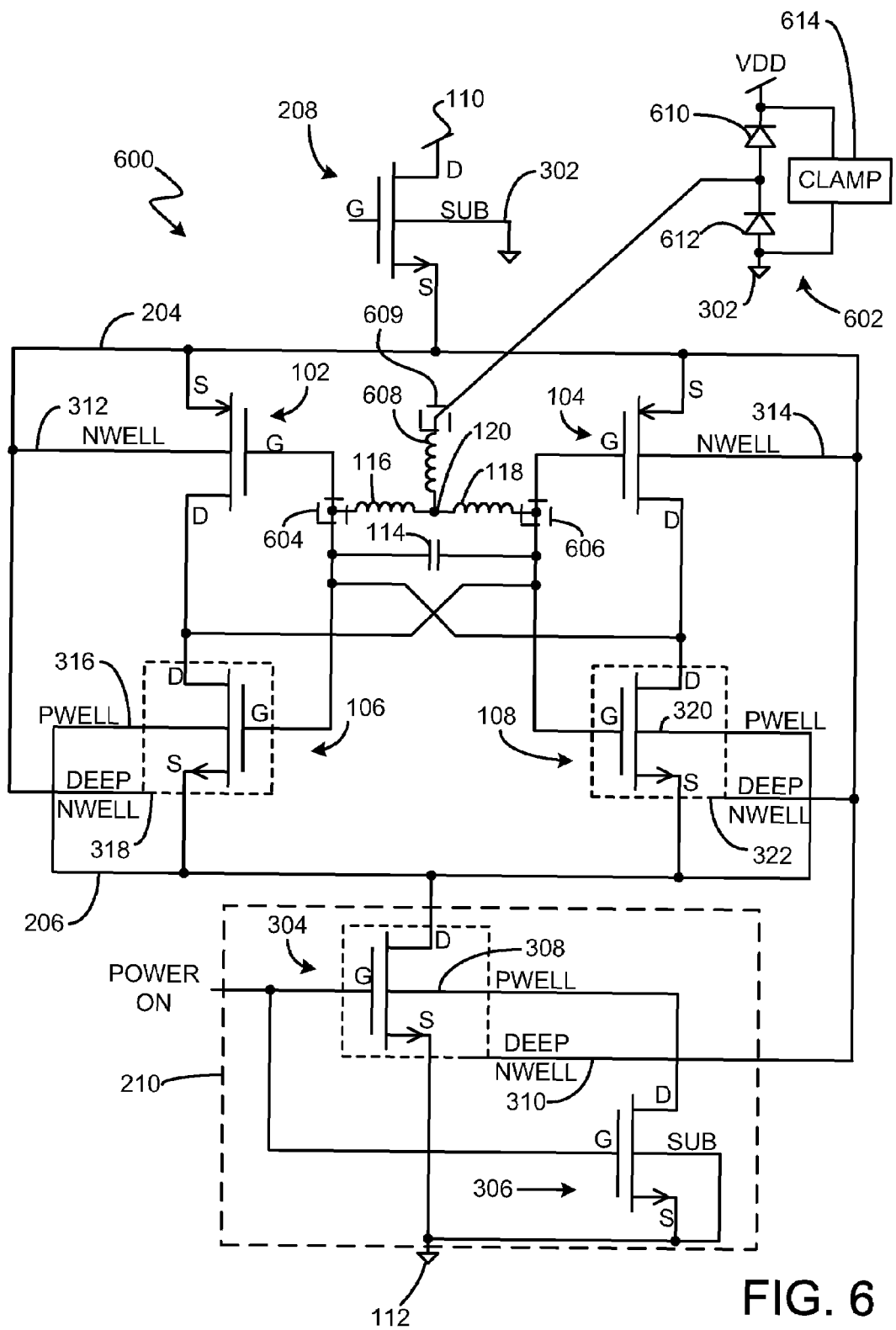
FIG. 6 is a partial block diagram and partial circuit diagram of a VCO using a bondwire inductor arrangement according to yet another particular embodiment of the present invention.

FIG. 6 is a circuit diagram of an alternative circuit 600 with an ESD protection circuit coupled to a VCO using a bondwire inductor arrangement. The circuit 600 includes a circuit arrangement similar to the circuit 300 of FIG. 3, except that the ESD protection circuit 602 provides the parallel ESD discharge path. In general, the bondwire inductor 116 is provided through bond pad 604 to a common pin 120. The bondwire inductor 118 is provided through bond pad 606 to the common pin 120. A third bondwire inductor 608 can be fabricated in parallel with bondwire inductors 116 and 118 or orthogonal to bondwire inductors 116 and 118 to couple an ESD protection circuit 602 via a bond pad 609. In general, to prevent magnetic coupling between the bondwire inductors 116 and 118, the third bondwire inductor 608 is either centered between and parallel to the inductors 116 and 118, or the bondwire inductor 608 is arranged orthogonal to the inductors 116 and 118.

The third bondwire inductor 608 is connected to the inductors 116 and 118 at the common pin 120. The third bondwire inductor 608 is centered and parallel to the inductors 116 and 118 and at a center node of the inductors 116 and 118.

The ESD circuit 602 is coupled to the third bondwire inductor 608 via bond pad 609. The ESD circuit 602 includes diodes 610 and 612 and a clamp 614. The diode 610 includes a cathode terminal connected to the voltage supply terminal 110 and an anode terminal coupled to the common pin 120 through the bondwire inductor 608. The diode 612 includes an anode terminal connected to the voltage supply terminal 302 and a cathode terminal coupled to the common pin 120 through the bondwire inductor 608. The voltage clamp 614 is connected to the cathode terminal of the diode 610 and to the anode terminal of the diode 612.

The third bondwire inductor 608 allows for the use of a very large voltage clamp and large diodes to sink high ESD transients without introducing coupling capacitances and inductances that could adversely impact the performance of the VCO. However, the embodiment of FIG. 6 may be sensitive to fabrication variances in terms of capacitive coupling and inductance mismatches, if the third bondwire 608 is off-center or not parallel with respect to bondwire inductors 116 and 118.

Figure 7:
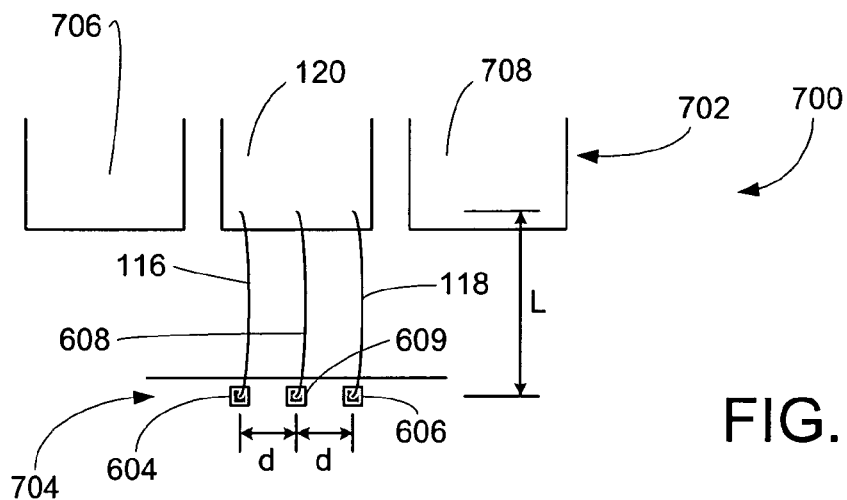
FIG. 7 is a topological diagram of a bondwire inductor arrangement with the third bondwire at a center node to couple an ESD protection circuit according to a particular embodiment of the circuit of FIG. 6.

FIG. 7 is a topological diagram of a bondwire inductor arrangement 700 with the third bondwire at a center node to couple an ESD protection circuit according to an embodiment of the circuit of FIG. 6. The bondwire inductor arrangement 700 includes a plurality of pins 702 and an integrated circuit substrate 704. The plurality of pins 702 includes pins 706 and 708 and common pin 120. The integrated circuit 704 includes a bond pad 604, 606 and 609. The bondwire inductor 116 couples the bond pad 604 to the common pin 120. The bondwire inductor 118 couples the bond pad 606 to the common pin 120. The third bondwire inductor 608 couples the common pin 120 to the bond pad 609. An ESD protection circuit may then be connected to the bond pad 609.

In this particular embodiment, the bondwire inductors 116, 118, and 608 are approximately evenly spaced and parallel such that the bondwire 608 is located at approximately a zero node between the bondwire inductors 116 and 118. Thus, the bondwire inductor 608 introduces little or no parasitic capacitances or inductances to the circuit. The bondwire inductors 116, 118 and 608 have a length (L) and are spaced by a distance (d). In one particular implementation, the bondwire inductors 116, 118 and 608 may have a length (L) of approximately 800 micrometers (μm) and may be separated by a distance (d) of approximately 200 μm, with a relative error of plus or minus 5 μm. The coupling between the bondwires follows a 1/R curve, which means that a worst case error should be as follows:

$$1 - \frac{190 \ \mu m}{210 \ \mu m} \times 100 = 10\% \ error$$

Figure 8:
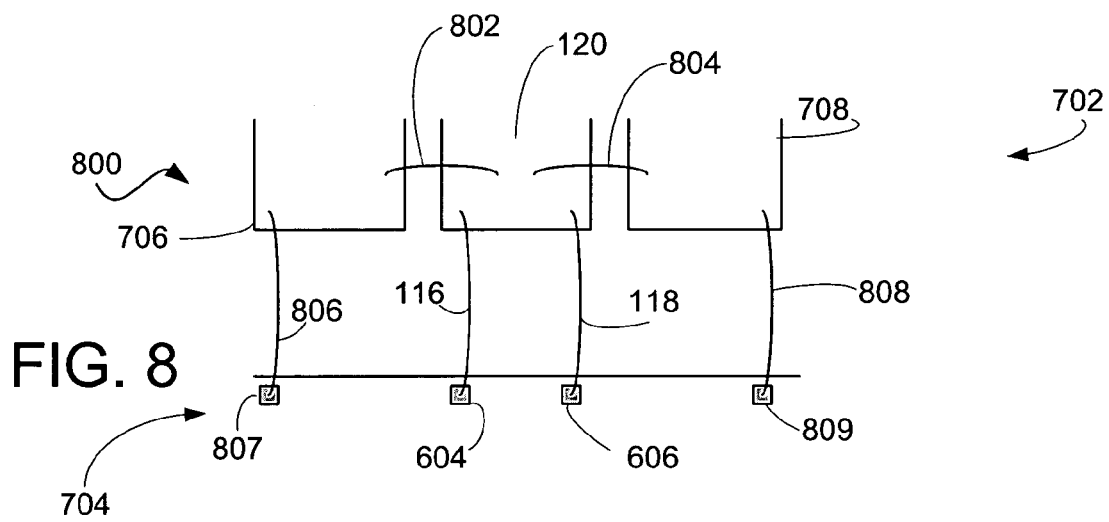
FIG. 8 is an illustration of a bondwire inductor arrangement with a bondwire inductor extending orthogonal to the bondwire inductor arrangement to couple an ESD protection circuit according to another particular embodiment of the circuit of FIG. 6.

FIG. 8 is a topological diagram of a bondwire inductor arrangement 800 with a bondwire inductor extending orthogonally relative to the bondwire inductor arrangement to couple an ESD protection circuit according to an embodiment of the circuit of FIG. 6. The arrangement 800 includes a plurality of pins 702, a substrate 704, bondwire inductors 116 and 118 coupled between bond pads 604 and 606 and common pin 120. In this instance, matching bondwires 802 and 804 are arranged orthogonally to bondwire inductors 116 and 118 and opposite to one another to connect pins 706 and 708 to the common pin 120, without magnetic coupling between the bondwires 802 and 804 and the bondwires 116 and 118. The pin 706 may be connected to the substrate 704 by a bondwire inductor 806, which is connected to a bond pad 807 on the substrate 704. An ESD protection circuit (such ESD protection circuit 340 including diodes 342 and 344 and an ESD clamp 346 as shown in FIG. 3, for example) may be connected to the bond pad 807. Similarly, the pin 708 may be connected to the substrate 704 by a bondwire inductor 808, which is connected to a bond pad 809 on the substrate 704. An ESD protection circuit may be connected to the bond pad 809. In one embodiment, one ESD protection circuit is coupled to both of the bond pads 807 and 809.

It should be understood that the topological illustrations of FIGS. 7 and 8 are provided for illustrative purposes only, and are not drawn to scale. Moreover, it should be understood that the bondwire inductors 806 and 808 may be spaced apart from the inductors 116 and 118, and need not be evenly spaced.

Figure 9:
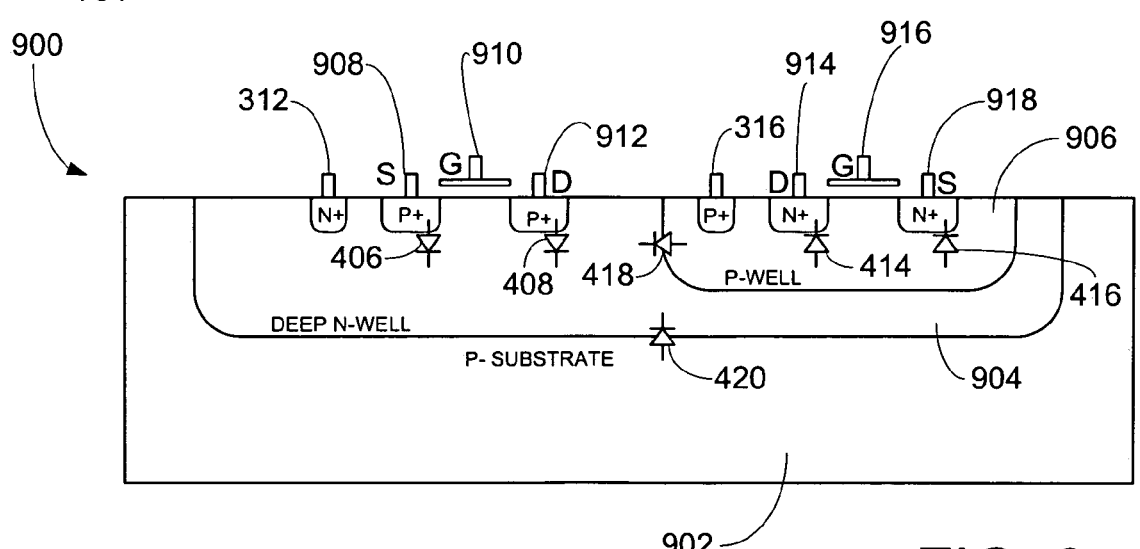
FIG. 9 is a cross-sectional diagram of a portion of an integrated circuit substrate having a p-channel transistor and an n-channel transistor formed in a substrate with a deep N-well.

FIG. 9 is a cross-sectional diagram of a portion of an integrated circuit substrate 900 including a p-channel transistor and an n-channel transistor formed in a substrate with a deep N-well. The substrate 900 includes a P-substrate 902, a deep N-well 904 infused into the P-substrate 902, and a P-well 906 infused into a portion of deep N-well 904. The MOS transistors 102 and 104 are formed in the substrate. The P-channel MOS transistor 102 includes an N-well 312, source terminal 908, gate terminal 910, and drain terminal 912, as well as parasitic diodes 406 and 408. The parasitic diode 406 corresponds to the PN junction between the source terminal 908 and the deep N-well 904. The parasitic diode 408 corresponds to the PN junction between the drain terminal 912 and the deep N-well 904. The N-channel MOS transistor 106 includes a P-well 316, a drain terminal 914, a gate terminal 916, and a source terminal 918, as well as parasitic diodes 414 and 416. The parasitic diode 414 corresponds to the PN junction between the P-well 906 and the drain terminal 914. The parasitic diode 416 corresponds to the PN junction between the P-well 906 and the source terminal 918. Additionally, diode 418 represents the PN diode junction between the P-well 906 and the deep N-well 904. The diode 420 represents the PN diode junction between the P-substrate 902 and the deep N-well 904.

In general, the embodiments described above have focused on a VCO circuit; however, it should be understood that the ESD protection system and methods described above are applicable to other circuits as well, such as low noise amplifiers, and the like. In particular, the ESD protection scheme is applicable to any circuit that may be exposed to ESD transients and that is sensitive to the addition of an ESD protection circuitry.

As long as the ESD protection diodes are sufficiently large and do not fail, then their maximum voltage during an ESD event should be limited to one diode junction plus on-resistance. The ESD protection diodes can thus provide an ESD path separate from the components within the protected circuit. The currents flowing through the protected circuit should be only those currents necessary to charge up the internal capacitances. Once the internal capacitances are charged, current through the VCO falls to approximately zero, while the ESD current flows through the ESD protection circuit.

The above-disclosed subject matter is to be considered illustrative, and not restrictive, and the appended claims are intended to cover all such modifications, enhancements, and other embodiments that fall within the true spirit and scope of the present invention. For example, while the above-discussion has largely focused on a MOS transistor implementation, it should be understood that other types of FETs may be used, depending on the specific implementation. Moreover, while examples of ESD protection circuits have been shown, other ESD protection circuits are also contemplated and could be used, depending on the specific implementation, on the desired amount of ESD protection, and so on. Additionally, while the power supplies have been indicated by reference numeral and have been referred to as first and second power supply voltage terminals within the above description, it should be understood that the first and the second power supply voltage terminals could be reversed in conjunction with a particular circuit implementation. Thus, to the maximum extent allowed by law, the scope of the present invention is to be determined by the broadest permissible interpretation of the following claims and their equivalents, and shall not be restricted or limited by the detailed description provided above.

What is claimed is:

1. An integrated circuit comprising:
first and second power supply voltage terminals;
a voltage controlled oscillator having a first node coupled to the first power supply voltage terminal, a second node, and first and second oscillator output terminals, at least one of the first and second oscillator output terminals coupled to a common pin; and
a deep N-well field-effect transistor (FET) having a first terminal coupled to the second node of the voltage controlled oscillator, a second terminal coupled to the second power supply voltage terminal, and a control electrode to receive a power on input signal, a deep N-well of the deep N-well FET is coupled to the first power supply voltage terminal and a P-channel of the deep N-well is coupled to the second power supply voltage terminal, thereby forming a high impedance electrostatic discharge (ESD) path between the common pin and the first and the second power supply voltage terminals through the deep N-well.

2. The integrated circuit of claim 1, further comprising:
an ESD protection circuit coupled to the common pin to provide a low impedance ESD path between the pin and one of the first and the second power supply voltage terminals.

3. The integrated circuit of claim 1, wherein the deep N-well of the FET is coupled to the first power supply voltage terminal and a P-well of the deep N-well FET is coupled to the second power supply voltage terminal through a second FET having a first terminal coupled to the P-channel of the deep N-well FET, a control terminal for receiving the power on input, and a second terminal coupled to the second power supply voltage terminal.

4. The integrated circuit of claim 1, wherein the voltage controlled oscillator is formed with a bondwire inductor coupled between the first and second oscillator output terminals through the common pin.

5. The integrated circuit of claim 4, wherein the bondwire inductor comprises a first bondwire inductor having a first terminal coupled to the first oscillator output terminal and a second terminal coupled to the common pin, and a second bondwire inductor having a first terminal coupled to the second oscillator output terminal and a second terminal coupled to the common pin.

6. The integrated circuit of claim 5, further comprising:
an ESD protection circuit coupled to the common pin by a third bondwire inductor parallel to and centered between the first and the second bondwire inductors.

7. The integrated circuit of claim 5, further comprising:
an ESD protection circuit coupled to the common pin by a third bondwire inductor orthogonal to the first and the second bondwire inductors.

8. The integrated circuit of claim 1, further comprising:
an ESD protection circuit coupled to the common pin, the ESD circuit comprising:
a first diode having a cathode terminal coupled to a first power supply voltage terminal, and an anode terminal coupled to the common pin; and
a second diode having a cathode terminal coupled to the common pin and an anode terminal coupled to the second power supply voltage terminal;
wherein the ESD circuit provides a low impedance ESD path between the common pin and the first and the second power supply voltage terminals through the first and the second diodes.

9. The integrated circuit of claim 8, wherein the ESD protection circuit further comprises:
a voltage clamp element coupled to the anode of the first diode and to the cathode of the second diode to limit a positive polarity ESD voltage.

10. The integrated circuit of claim 1, further comprising:
a first ESD circuit coupled to the first oscillator output terminal and to the first and the second power supply voltage terminals; and
a second ESD circuit coupled to the second oscillator output terminal and to the first and the second power supply voltage terminals;
wherein the first and the second ESD circuits to provide a low impedance ESD path from the common pin to the first and the second power supply voltage terminals.

11. An integrated circuit comprising:
first and second power supply voltage terminals;
a voltage controlled oscillator having a first node coupled to the first power supply voltage terminal, a second node, and first and second oscillator output terminals, at least one of the first and second oscillator output terminals coupled to a common pin;
a first electrical switch having a first terminal coupled to the second node, a second terminal coupled to the second power supply voltage terminal, and a control terminal to receive an activation signal, the first electrical switch providing a high impedance in an electrostatic discharge (ESD) path between the common pin and the second power supply voltage terminal when the first electrical switch is inactive; and
an ESD circuit coupled to the voltage controlled oscillator and to the second power supply voltage terminal forming a low impedance ESD path between the common pin and the second power supply voltage terminal when the first electrical switch is inactive.

12. The integrated circuit of claim 11, wherein the first electrical switch comprises a first field effect transistor (FET) having a deep n-well configuration.

13. The integrated circuit of claim 12, wherein the deep N-well of the first FET is coupled to the first power supply voltage terminal and a P-well of the first FET is coupled to the second power supply voltage terminal through a second FET having a first terminal coupled to the P-well of the first FET, a control terminal for receiving a power on input, and a second terminal coupled to the second power supply voltage terminal.

14. The integrated circuit of claim 11, wherein the voltage controlled oscillator is formed with a bondwire inductor coupled between the first and second oscillator output terminals.

15. The integrated circuit of claim 14, wherein the ESD circuit is coupled to the voltage controlled oscillator by a second bondwire at a center node of the bondwire inductor.

16. The integrated circuit of claim 11, wherein the ESD circuit comprises a first ESD circuit coupled to the first and the second power supply voltage terminals and to the first oscillator output terminal to provide a first low-impedance ESD discharge path, and a second ESD circuit coupled to the first and the second power supply voltage terminals and to the second oscillator output terminals to provide a second low-impedance ESD discharge path.

17. An integrated circuit comprising:
a common pin;

a first and a second power supply voltage terminal;

a circuit component of an integrated circuit having first and second nodes and coupled to the common pin, wherein the circuit component is active when the first node is coupled to the first power supply voltage terminal and the second node is coupled to the second power supply voltage terminal; and an electrostatic protection system to couple the circuit component to the first and the second power supply voltage terminals when the circuit component is active, and to isolate electrically the circuit component from at least one of the first and the second power supply voltage terminals and to provide a parallel low impedance path to the at least one of the first and second power supply voltage terminals for transients, when the circuit component is inactive.

18. The integrated circuit of claim 17, wherein the circuit component comprises a voltage controlled oscillator.

19. The integrated circuit of claim 17, wherein the electrostatic protection system comprises:

a first plurality of diodes in series between the circuit component and the first power supply voltage terminal;

a second plurality of diodes in series between the circuit component and the second power supply voltage terminal; and wherein the parallel path comprises:

a low impedance electrostatic discharge (ESD) circuit coupled to the first and the second power supply voltage terminals and to the common pin to provide a low impedance ESD path between the common pin and the first and the second power supply voltage terminals.

20. The integrated circuit of claim 17, wherein the circuit component further comprises first and second bondwire inductors coupled to the common pin.

21. The integrated circuit of claim 20, wherein the electrostatic protection system comprises an ESD discharge circuit coupled to the circuit component via a third bondwire inductor coupled to the common pin.

22. The integrated circuit of claim 21, wherein the third bondwire inductor is parallel to and centered between the first and the second bondwire inductors.

23. The integrated circuit of claim 21, wherein the third bondwire inductor is orthogonal to the first and the second bondwire inductors.

* * * * *